United States Patent
Wu et al.

(10) Patent No.: US 7,273,824 B2
(45) Date of Patent: Sep. 25, 2007

(54) SEMICONDUCTOR STRUCTURE AND FABRICATION THEREFOR

(75) Inventors: Yi-Ching Wu, Kaohsiung County (TW); Jiann-Fu Chen, Hsinchu (TW); Chih-Hsiang Shiau, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 124 days.

(21) Appl. No.: 10/710,405

(22) Filed: Jul. 8, 2004

(65) Prior Publication Data

US 2006/0006545 A1    Jan. 12, 2006

(51) Int. Cl.
*H01L 21/304* (2006.01)
(52) U.S. Cl. ............... 438/978; 438/928; 438/963; 257/E21.214; 257/E21.237
(58) Field of Classification Search ............... 438/928, 438/963, 978; 257/E21.214, E21.237
See application file for complete search history.

(56) References Cited

U.S. PATENT DOCUMENTS

| | | | |
|---|---|---|---|
| 6,734,096 B2 * | 5/2004 | Dalton et al. | 438/624 |
| 6,737,747 B2 * | 5/2004 | Barth et al. | 257/760 |
| 6,933,234 B2 | 8/2005 | Nakamura et al. | 438/690 |
| 2005/0194619 A1 * | 9/2005 | Edelstein et al. | 257/232 |
| 2005/0221606 A1 * | 10/2005 | Lee et al. | 438/624 |
| 2005/0250423 A1 | 11/2005 | Nakamura et al. | 451/41 |

* cited by examiner

*Primary Examiner*—Evan Pert
*Assistant Examiner*—Victor A. Mandala, Jr.
(74) *Attorney, Agent, or Firm*—Jianq Chyun IP Office

(57) ABSTRACT

A semiconductor structure and a method of fabrication there-for are provided. The semiconductor structure comprises a substrate, a dielectric layer disposed over the substrate, a hydrophilic material layer disposed over the dielectric layer, and a hardmask layer disposed over the hydrophilic material layer. It is noted that, the edge of the semiconductor structure may be polished after the hydrophilic material layer is formed over the dielectric layer and before the hardmask layer is formed over the hydrophilic material layer.

14 Claims, 4 Drawing Sheets

SEMICONDUCTOR STRUCTURE AND FABRICATION THEREFOR

BACKGROUND OF INVENTION

1. Field of the Invention

The present invention generally relates to a semiconductor structure and fabrication therefor. More particularly, the present invention relates to a semiconductor structure having a dielectric material.

2. Description of Related Art

Recently, in the development of semiconductor process, the size of the component is minimized to sub-micron level. Therefore, in order to reduce the retardation time (RC time delay) of the transmission of the metal line, conducting wire made of the copper (Cu) is used instead of the aluminum (Al) because the resistance of copper is lower than that of the aluminum. In addition, the use of low dielectric constant (low-k) material for achieving high operating speed is also known. In general, the conventional low dielectric constant (low-k) material may be classified into spin on coating low-k material and chemical vapor deposition (CVD) low-k material by the deposition method. However, the conventional low dielectric constant (low-k) material may be classified into inorganic low-k material, organic low-k material and inorganic/organic combined low-k material by the component of the material.

Hereinafter, the conventional dual damascene structure will be illustrated and described. FIG. 1 is a cross-sectional view schematically illustrating a conventional dual damascene structure. Referring to FIG. 1, the conventional dual damascene structure 100 includes a substrate 102, a first dielectric layer 104, a first hardmask layer 108, a via 106, a second dielectric layer 110, a second hardmask layer 114 and a trench 112. In general, since the dielectric constant of the organic dielectric material is lower than that of the inorganic dielectric material, the organic dielectric layer is advantageously applied. In addition, the process of using the organic dielectric material is different from the process of using the inorganic dielectric material. For example, generally the characteristic and property of etching of the low-k organic dielectric material are similar to that of the photoresist layer, i.e., the etch selectivity is poor. Therefore, in the manufacturing process, before the photoresist layer is formed, a hardmask layer such as a metal layer an inter-metal compound layer is formed to serve as an etching mask for the subsequent steps. However since the surface property of the organic dielectric material and that of the hardmask layer are different, defects are easily generated during the formation of the hardmask layer.

In addition, the surface of the low-k organic dielectric layer is generally hydrophobic. Therefore, when a wet process is performed to the surface of the low-k organic dielectric layer, water marks are easily formed on the surface thereof. In other words, the surface of the low-k organic dielectric layer is not suitable for wet process.

Moreover, during the etching of the low-k organic dielectric layer, polymer residues are easily generated that would deposit on the edge of the wafer. The residues will adversely influence the subsequent process.

Accordingly, a semiconductor process capable of reducing the defects and reducing formation of water marks on the low-k dielectric material is highly desirable. Further, a process of easily removing the polymer residues from the edge of the wafer is also highly desirable.

SUMMARY OF INVENTION

Therefore, the present invention is directed to a semiconductor process of reducing generation of defects and water marks on a surface of the dielectric layer. The aforementioned process allows removal residues deposited on the edge of the wafer.

In addition, the present invention is directed to a semiconductor structure comprising a dielectric material having reduced defects and water marks, and reduced residues on the edge of the wafer.

According to an embodiment of the present invention, first, a substrate is provided. Next, a dielectric layer is formed over the substrate. Next, a hydrophilic material layer is formed over the dielectric layer. Thereafter, a hardmask layer is formed over the hydrophilic material layer.

In one embodiment of the invention, after the hydrophilic material layer is formed over the dielectric layer and before the hardmask layer is formed over the hydrophilic material layer, a planarization step is carried to polish on an edge of the substrate, the dielectric layer, the hydrophilic material layer or a combination thereof. In another embodiment of the invention, the planarization process comprises at least one of an upper bevel polish, a lower bevel polish, a side polish or a combination thereof.

In one embodiment of the invention, a method of forming the dielectric layer comprises a spin on coating method or a chemical vapor deposition method.

In one embodiment of the invention, a material of the dielectric layer comprises an organic dielectric material, a carbon-containing dielectric material or a carbon-containing oxide material. In another embodiment of the invention, the dielectric layer is composed of at least a precursor comprising tetramethyl-cyclotetra-siloxane (TMCTS), trimethyl-silane (3 MS), tetramethyl-silane (4 MS), dimethyl-dimethoxy-silane (DMDMOS), octamethyl-cyclotetrasiloxane (OMCTS), diethoxy-methyl-silane (DEMS), or tetramethyl-disiloxane (TMDSO).

In one embodiment of the invention, a material of the hydrophilic material layer comprises silane ($SiH_4$) containing material, tetraethyl-ortho-silicate (TEOS) oxide containing material or silicon nitride.

In one embodiment of the invention, a material of the hardmask layer comprises aluminum (Al), titanium nitride, tantalum nitride, titanium silicon nitride (TiSiN), tungsten nitride, tungsten silicon nitride (WSiN) or refractory nitride.

In addition, the present invention provides a semiconductor structure. The structure comprises, for example but not limited to, a substrate, a dielectric layer disposed over the substrate, a hydrophilic material layer disposed over the dielectric layer, and a hardmask layer, disposed over the hydrophilic material layer.

In one embodiment of the invention, after the hydrophilic material layer is disposed over the dielectric layer and before the hardmask layer is disposed over the hydrophilic material layer, a planarizing step is carried out to polish an edge of the semiconductor structure.

In one embodiment of the invention, a method of forming the dielectric layer comprises a spin on coating method or a chemical vapor deposition method.

In one embodiment of the invention, a material of the dielectric layer comprises an organic dielectric material, a carbon-containing dielectric material or a carbon-containing oxide material. In another embodiment of the invention, the dielectric layer is composed of at least a precursor comprising tetramethyl-cyclotetra-siloxane (TMCTS), trimethyl-silane (3 MS), tetramethyl-silane (4 MS), dimethyldimethoxy-silane (DMDMOS), octamethyl-cyclotetra-siloxane (OMCTS), diethoxy-methyl-silane (DEMS), or tetramethyl-disiloxane (TMDSO).

In one embodiment of the invention, a material of the hydrophilic material layer comprises silane ($SiH_4$) containing material, tetraethyl-ortho-silicate (TEOS) oxide containing material or silicon nitride.

In one embodiment of the invention, a material of the hardmask layer comprises aluminum (Al), titanium nitride, tantalum nitride, titanium silicon nitride (TiSiN), tungsten nitride, tungsten silicon nitride (WSiN) or refractory nitride.

Moreover, the present invention provides a semiconductor structure. The structure comprises, for example but not limited to, a substrate, a first dielectric layer disposed over the substrate, a first hydrophilic material layer disposed over the first dielectric layer, a first hardmask layer disposed over the first hydrophilic material layer, a second dielectric layer disposed over the first hardmask layer, a second hydrophilic material layer disposed over the second dielectric layer, and a second hardmask layer disposed over the second hydrophilic material layer.

In one embodiment of the invention, a via is disposed in the first dielectric layer, the first hydrophilic material layer and the first hardmask layer. In another embodiment of the invention, a trench is formed in the second dielectric layer over the via, wherein the trench exposes the via. In one another embodiment of the invention, a metal is disposed in the via and the trench.

In one embodiment of the invention, after the first hydrophilic material layer is disposed over the first dielectric layer and before the first hardmask layer is disposed over the first hydrophilic material layer, a planarizing step is carried out to polish an edge of the structure of semiconductor. In another embodiment of the invention, after the second hydrophilic material layer is disposed over the second dielectric layer and before the second hardmask layer is disposed over the second hydrophilic material layer, a planarizing step is carried out to polish an edge of the structure of semiconductor.

In one embodiment of the invention, a method of forming the first dielectric layer or the second dielectric layer comprises a spin on coating method or a chemical vapor deposition method.

In one embodiment of the invention, a material of the first dielectric layer or a material of the second dielectric layer comprises an organic dielectric material, a carbon-containing dielectric material or a carbon-containing oxide material. In another embodiment of the invention, the first dielectric layer or the second dielectric layer is composed of at least a precursor comprising tetramethyl-cyclotetra-siloxane (TMCTS), trimethyl-silane (3 MS), tetramethyl-silane (4 MS), dimethyl-dimethoxy-silane (DMDMOS), octamethyl-cyclotetra-siloxane (OMCTS), diethoxy-methyl-silane (DEMS), or tetramethyl-disiloxane (TMDSO).

In one embodiment of the invention, a material of the first hydrophilic material layer or a material of the second hydrophilic material comprises silane ($SiH_4$) containing material, tetraethyl-ortho-silicate (TEOS) oxide containing material or silicon nitride.

In one embodiment of the invention, a material of the first hardmask layer or a material of the second hardmask layer comprises aluminum (Al), titanium nitride, tantalum nitride, titanium silicon nitride (TiSiN), tungsten nitride, tungsten silicon nitride (WSiN) or refractory nitride.

Accordingly, in the present invention, since a hydrophilic material layer is formed over the dielectric layer, to the possibility of formation water marks on the surface of the hydrophilic material layer can be effectively reduced. Therefore, in the present invention, a wet process, for example but not limited to, a planarization step may performed on the dielectric layer or the hydrophilic material layer. Thus, the conventional problem of generation of water marks on the surface of the surface of the dielectric layer and the residuals on the edge of the wafer can be effectively reduced. In addition, since the surface property of the hydrophilic material layer and the hardmask layer are similar, generation of defects during the formation of the hardmask layer can be effectively reduced. In summary, the present invention is directed to a semiconductor structure and a process there-for in which generation of defects and water marks can be substantially reduced, and allows effective removal of the residuals from the edges of the semiconductor structure.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
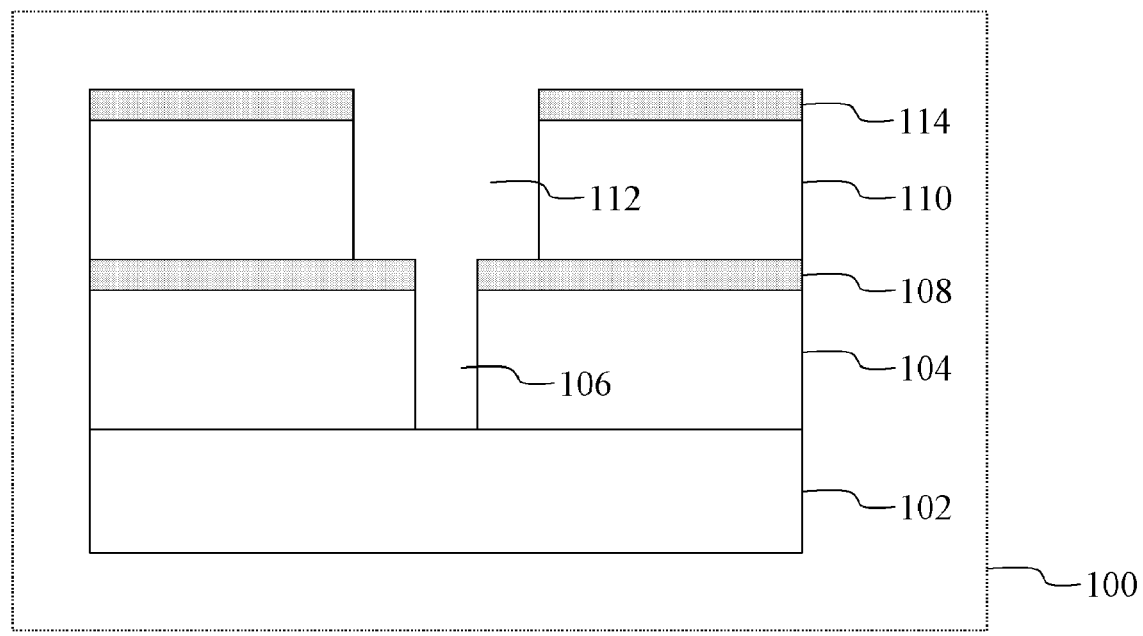
FIG. 1 is a cross-sectional view schematically illustrating a conventional dual damascene structure.
Figure 2A:
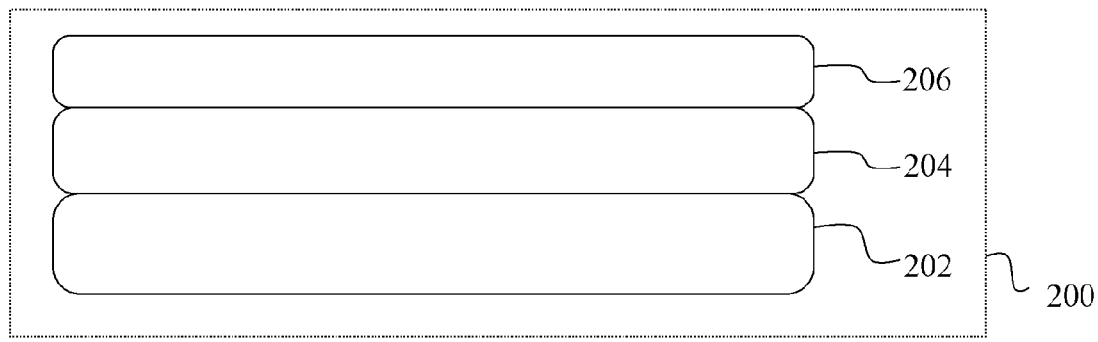
FIG. 2A to FIG. 2C are cross-sectional views schematically illustrating a manufacturing process of a semiconductor structure according to one embodiment of the present invention.
Figure 2B:
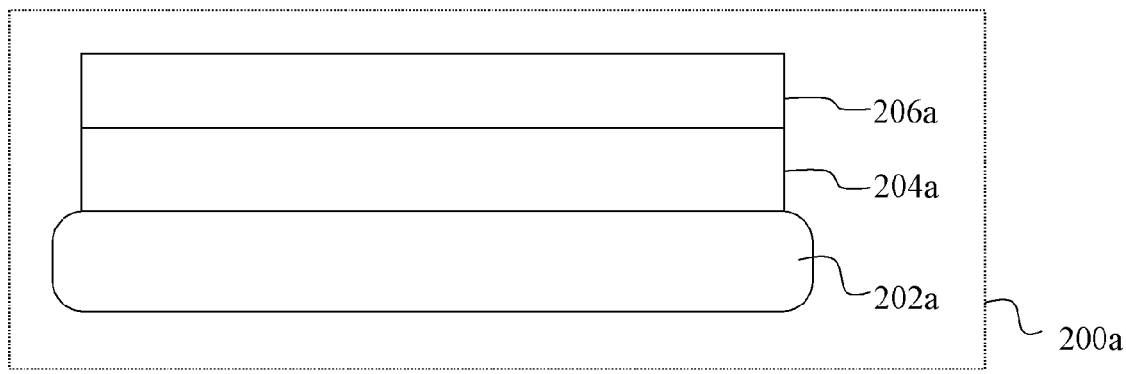
Figure 2C:
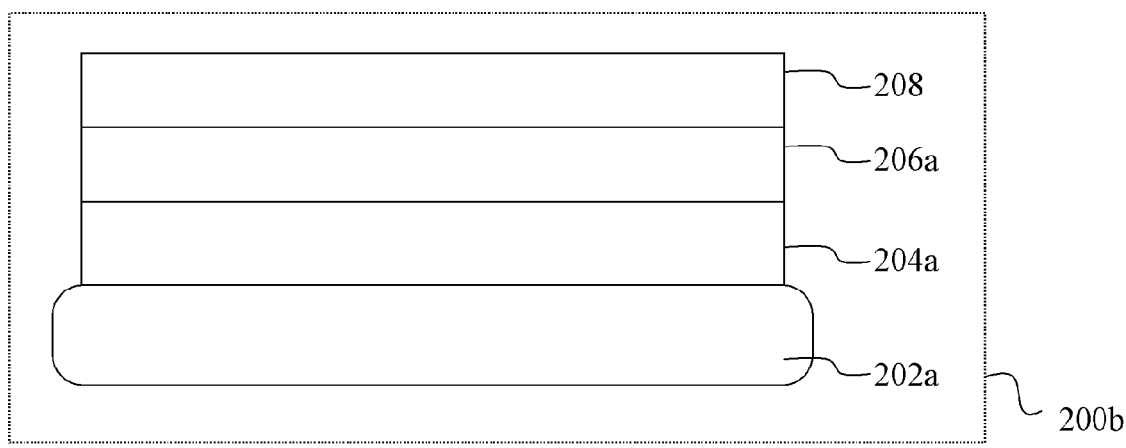

FIG. 2A to FIG. 2C are cross-sectional views schematically illustrating a manufacturing process of a semiconductor structure according to one embodiment of the present invention. Referring to FIG. 2A, in the present invention, first of all, a substrate 202 is provided, wherein the substrate can be composed of any suitable material. Thereafter, a dielectric layer 204 is formed over the substrate 202. In another embodiment of the present invention, the range of the dielectric constant of the dielectric layer 204 is not limited, i.e., the dielectric layer 204 of the present invention may have any value of dielectric constant. The material of the dielectric layer 204 comprises, for example but not limited to, an organic dielectric material, a carbon-containing dielectric material or a carbon-containing oxide material. In another embodiment of the present invention, the dielectric layer is composed of a precursor comprising, for example but not limited to, tetramethyl-cyclotetra-siloxane (TMCTS), trimethyl-silane (3 MS), tetramethyl-silane (4 MS), dimethyl-dimethoxy-silane (DMDMOS), octamethyl-cyclotetra-siloxane (OMCTS), diethoxy-methyl-silane (DEMS), or tetramethyl-disiloxane (TMDSO). In one embodiment of the present invention, the method of forming the dielectric layer 204 comprises, for example but not limited to, a spin on coating method or a chemical vapor deposition (CVD) method.

Thereafter, referring to FIG. 2A, a hydrophilic material layer 206 is formed over the dielectric layer 204. In one embodiment of the present invention, the material of the hydrophilic material layer 206 comprises silane ($SiH_4$) containing material, tetraethyl-ortho-silicate (TEOS) oxide containing material or silicon nitride. The method of forming the hydrophilic material layer 206 comprises, for example but not limited to, a spin on coating method or a chemical vapor deposition (CVD) method.

In general, when the dielectric layer 204 or the hydrophilic material layer 206 is formed, residuals easily adhere on the edge of the wafer as shown in FIG. 2A due to, for example, the organic polymer residues generated during the etching of the organic dielectric layer 204. Therefore, in one embodiment of the present invention, a portion of the substrate 202, the dielectric layer 204 or the hydrophilic material layer 206 having residuals on the edge thereof is polished.

Figure 3:
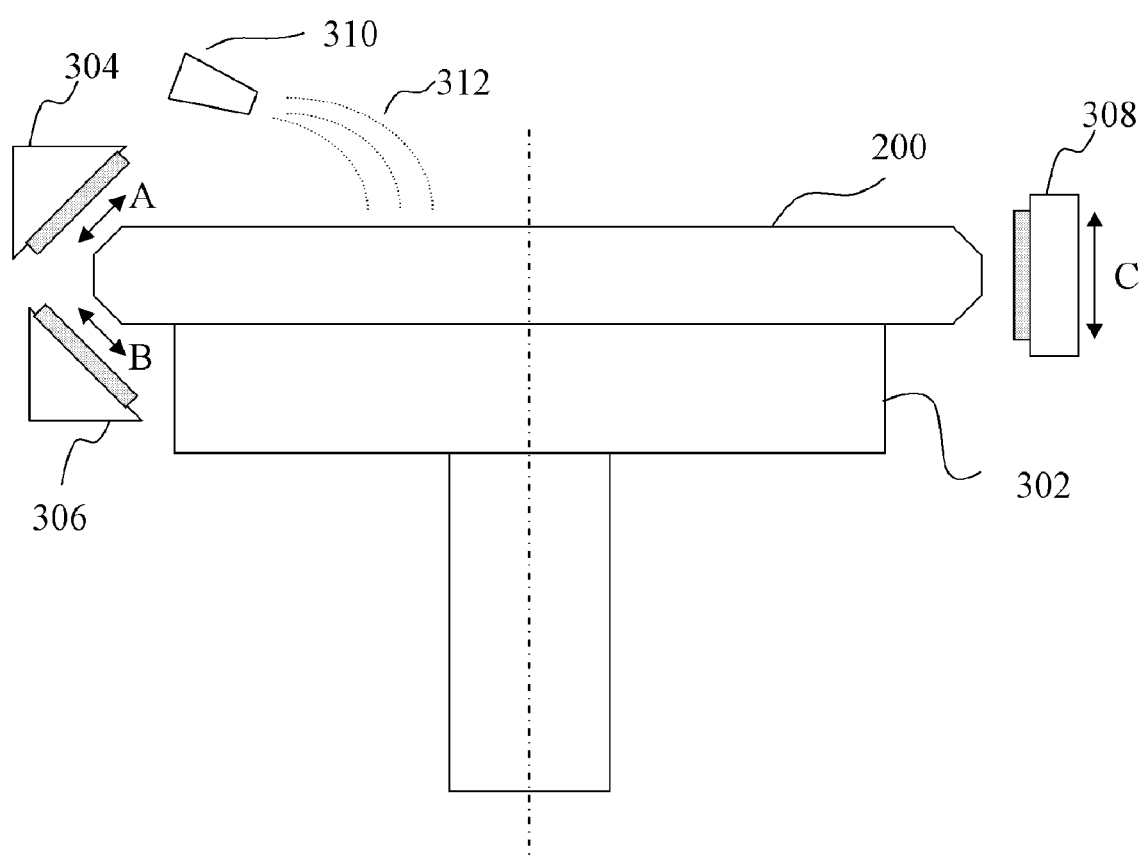
FIG. 3 is a cross-sectional view illustrating a planarization process of the edge of the wafer according to one embodiment of the present invention.

FIG. 3 is a cross-sectional view illustrating a planarization process of the edge of the wafer according to one embodiment of the present invention. Referring to FIG. 3, first of all, the semiconductor structure 200 formed in the process shown in FIG. 2A is fixed on the rotation plate 302 by, for example, vacuum suction. Thereafter, an upper bevel pad 304, a lower bevel pad 306 or a side portion pad 308 is provided to polish the edge of the semiconductor structure 200. In the planarization process, the nozzle 310 injects the slurry to the surface of the semiconductor structure 200. In addition, the upper bevel pad 304, the lower bevel pad 306 or the top portion pas 308 may move along the direction indicated by the arrows A, B, and C shown in FIG. 3 to polish the edge of the semiconductor structure 200. Moreover, the angle between the surface of the edge of the semiconductor structure 200 and the surface of the upper bevel pad 304, the lower bevel pad 306 or a top portion pad 308 may also be changed. Therefore, the fabrication of the semiconductor structure 200a comprising, for example but not limited to, polished substrate 202a, a dielectric layer 204a and a hydrophilic material layer 206a as shown in FIG. 2B is completed.

Next, referring to FIG. 2C, a hardmask layer 208 is formed over the polished hydrophilic material layer 206a. In one embodiment of the present invention, the material of the hardmask layer 208 comprises, for example but not limited to, aluminum (Al), titanium nitride, tantalum nitride, titanium silicon nitride (TiSiN), tungsten nitride, tungsten silicon nitride (WSiN) or refractory nitride.

Referring to FIG. 2C, the present invention provides a semiconductor structure 200b comprising, for example but not limited to, a substrate 202a, a dielectric layer 204a, a hydrophilic material layer 206a and a hardmask layer 208. In one embodiment of the invention, the hydrophilic material layer is formed over the dielectric layer and e the hardmask layer is formed over the hydrophilic material layer, wherein the edges of the substrate, the dielectric layer or the hydrophilic material layer are polished.

Accordingly, in the present invention, since a hydrophilic material layer is formed over the dielectric layer, to the possibility of formation of water marks on the surface of the hydrophilic material layer can be effectively reduced. Accordingly, a wet process, for example but not limited to, a polishing process may be performed on the dielectric layer or the hydrophilic material layer. Thus, the conventional problem of generation of water marks on the surface of the surface of the dielectric layer, and the residuals deposited on the edge of the wafer can be effectively reduced. In addition, since the surface property of the hydrophilic material layer and the hardmask layer is similar, generation of defects during the formation of the hardmask layer can be effectively reduced. In summary, the present invention is directed to a semiconductor structure and a process there-for generation of defects and water marks on the dielectric layer can be effectively reduced, and the residuals due to organic polymer residues generated during the etching of the organic dielectric layer can be easily removed.

In addition, it should be noted that the present invention can be applicable to any semiconductor process for fabricating any semiconductor structure including a dielectric layer, and therefore the present invention should not be limited to the embodiments described above. For example but not limited to, in the fabrication of conventional single damascene structure or dual damascene structure, or can be suitably applied in the via-first process, the trench-first process, or the self-aligned process of the dual damascene structure.

Figure 4:
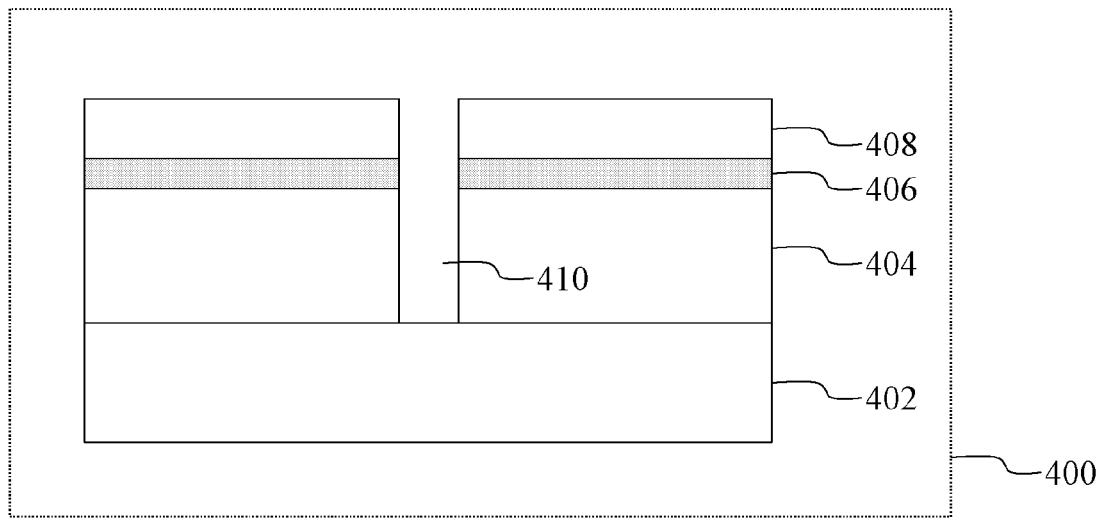
FIG. 4 is a cross-sectional view schematically illustrating a single damascene structure according to one embodiment of the present invention.

FIG. 4 is a cross-sectional view schematically illustrating a single damascene structure according to one embodiment of the present invention. Referring to FIG. 4, the single damascene structure 400 comprises, for example but not limited to, a substrate 402, a dielectric layer 404 disposed over the substrate 402, a hydrophilic material layer 406 disposed over the dielectric layer 404, and a hardmask layer 408 disposed over the hydrophilic material layer 406. It is noted that a via 410 or a trench 410 may be formed in the dielectric layer 404, the hydrophilic material layer 406 and the hardmask layer 408. In one embodiment of the present invention, after the hydrophilic material layer 406 is disposed over the dielectric layer 404 and before the hardmask layer 408 is disposed over the hydrophilic material layer 406, the edge of the substrate 402, the dielectric layer 404 or the hydrophilic material layer 406 may be polished. In one embodiment of the invention, the material, the property of the substrate 402, the dielectric layer 404, the hydrophilic material layer 406 or the hardmask layer 408 and the method of fabrication thereof are similar to the embodiments described above and the detail description thereof will not be repeated again.

Figure 5:
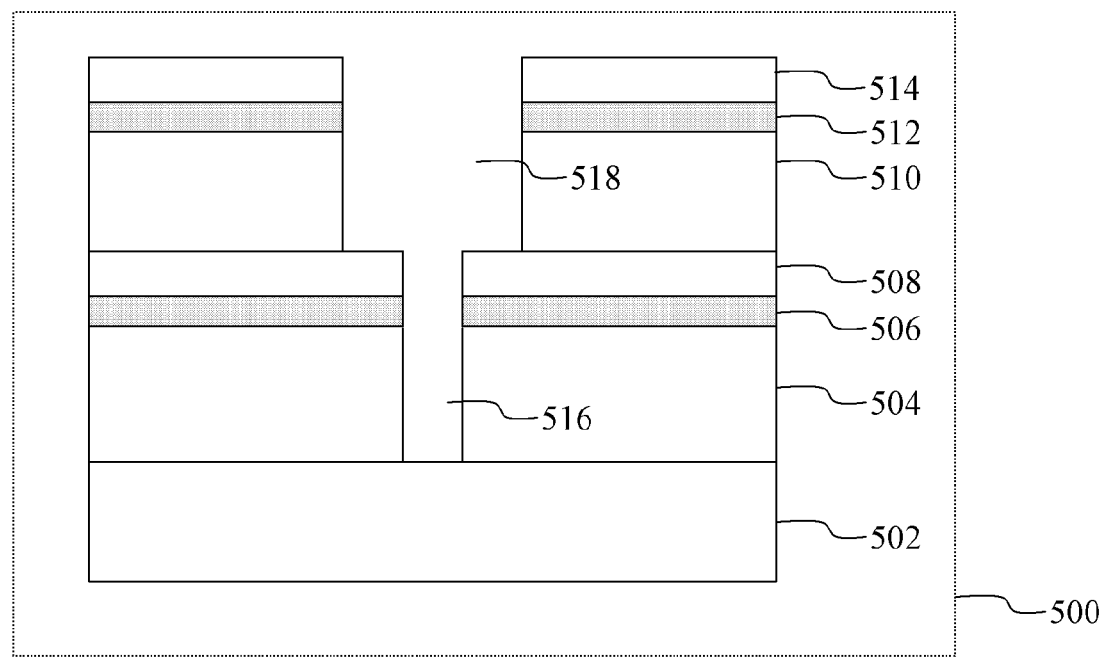
FIG. 5 is a cross-sectional view schematically illustrating a dual damascene structure according to one embodiment of the present invention.

FIG. 5 is a cross-sectional view schematically illustrating a dual damascene structure according to one embodiment of the present invention. Referring to FIG. 5, the dual damascene structure 500 comprises, for example but not limited to, a substrate 502, a first dielectric layer 504 disposed over the substrate 502, a first hydrophilic material layer 506 disposed over the first dielectric layer 504, a first hardmask layer 508 disposed over the first hydrophilic material layer 506, a second dielectric layer 510 disposed over the first hardmask layer 508, a second hydrophilic material layer 512 disposed over the second dielectric layer 510, and a second hardmask layer 514 disposed over the second hydrophilic material layer 512. A via 516 is formed in the first dielectric layer 504, the first hydrophilic material layer 506 and the first hardmask layer 508. A trench 518 is formed in the second dielectric layer 510, the second hydrophilic material layer 512 and the second hardmask layer 514. In one embodiment of the present invention, after the first hydrophilic material layer 506 is disposed over the first dielectric layer 504 and before the first hardmask layer 508 is disposed over the first hydrophilic material layer, the edge of the dual damascene structure 500 may be polished. In addition, after the second hydrophilic material layer 512 is disposed over the second dielectric layer 510 and before the second hardmask layer 514 is disposed over the second hydrophilic material layer 512, the edge of the dual damascene structure 500 may be polished. In one embodiment of the present invention, the material, the property of each layer of the dual damascene structure 500 and the process of fabrication thereof are similar to the embodiments described above and therefore will not be repeated again.

In one embodiment of the present invention, the method of forming the damascene structure 500 shown in FIG. 5 comprises, for example but not limited to, a via-first method, a trench-first method, or a self-aligned method.

Accordingly, in the present invention, since a hydrophilic material layer is formed over the dielectric layer, to the possibility of formation water marks on the surface of the hydrophilic material layer can be effectively reduced. Therefore, a wet process, for example but not limited to, a polish step may be performed on the dielectric layer or the hydrophilic material layer. Thus, the conventional problem of formation of water marks on the surface of the surface of the dielectric layer can be effectively reduced, and the residuals on the edge of the wafer can be effectively removed. In addition, since the surface property of the hydrophilic material layer and the hardmask layer is similar, generation defects during the formation of the hardmask layer can be effectively reduced. In summary, the present invention is directed a semiconductor structure and a fabrication method therefor capable of reducing formation of defects and water marks, and allows easy removal of the residues from the edges of the semiconductor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A process of fabrication a semiconductor structure, comprising:

providing a substrate;

forming a dielectric layer over the substrate;

forming a hydrophilic material layer over the dielectric layer to form a structure comprised of the substrate, the dielectric layer and the hydrophilic material layer;

performing a polish process on at least one of the upper bevel of the structure, the lower bevel of the structure, the side wall of the structure and a combination thereof; and forming a hardmask layer over the hydrophilic material layer.

2. The process of claim 1, wherein a method of forming the dielectric layer comprises a spin on coating method or a chemical vapor deposition method.

3. The process of claim 1, wherein a material of the dielectric layer comprises an organic dielectric material, a carbon-containing dielectric material or a carbon-containing oxide material.

4. The process of claim 1, wherein the dielectric layer is composed of at least a precursor comprising tetramethyl-cyclotetra-siloxane (TMCTS), trimethyl-silane (3MS), tetramethyl-silane (4MS), dimethyl-dimethoxy-silane (DMDMOS), octamethyl-cyclotetra-siloxane (OMCTS), diethoxy-methyl-silane (DEMS), or tetramethyl-disiloxane (TMDSO).

5. The process of claim 1, wherein a material of the hydrophilic material layer comprises silane ($SiH_4$) containing material, tetraethyl-ortho-silicate (TEOS) oxide containing material or silicon nitride.

6. The process of claim 1, wherein a material of the hardmask layer comprises aluminum (Al), titanium nitride, tantalum nitride, titanium silicon nitride (TiSiN), tungsten nitride, tungsten silicon nitride (WSiN) or refractory nitride.

7. A process of fabrication a semiconductor structure, comprising:

providing a substrate;

forming a first dielectric layer over the substrate;

forming a first hydrophilic material layer over the first dielectric layer to form a first structure comprised of the substrate, the first dielectric layer and the first hydrophilic material layer;

performing a first polish process on at least one of the upper bevel of the first structure, the lower bevel of the first structure, the side wall of the first structure and a combination thereof;

forming a first hardmask layer over the first hydrophilic material layer;

forming a second dielectric layer over the first hardmask layer;

forming a second hydrophilic material layer over the second dielectric layer to form a second structure comprised of the substrate, the first dielectric layer, the first hydrophilic material layer, the second dielectric layer and the second hydrophilic material layer;

performing a second polish process on at least one of the upper bevel of the second structure, the lower bevel of the second structure, the side wall of the second structure and a combination thereof; and forming a second hardmask layer over the second hydrophilic material layer.

8. The process of claim 7, wherein a method of forming the first and second dielectric layer comprises a spin on coating method or a chemical vapor deposition method.

9. The process of claim 7, wherein the first and second dielectric layer comprise an organic dielectric material, a carbon-containing dielectric material or a carbon-containing oxide material, respectively.

10. The process of claim 7, wherein the first and second dielectric layer are composed of at least a precursor comprising tetramethyl-cyclotetra-siloxane (TMCTS), trimethyl-silane (3MS), tetramethyl-silane (4MS), dimethyl-dimethoxy-silane (DMDMOS), octamethyl-cyclotetra-siloxane (OMCTS), diethoxy-methyl-silane (DEMS), or tetramethyl-disiloxane (TMDSO), respectively.

11. The process of claim 7, wherein the first and second hydrophilic material layers comprise silane ($SiH_4$) containing material, tetraethyl-ortho-silicate (TEOS) oxide containing material or silicon nitride, respectively.

12. The process of claim 7, wherein the second hardmask layers comprise aluminum (Al), titanium nitride, tantalum nitride, titanium silicon nitride (TiSiN), tungsten nitride, tungsten silicon nitride (WSiN) or refractory nitride.

13. The process of claim 7, further comprising forming a via in the first dielectric layer, the first hydrophilic layer and the first hardmask layer.

14. the process of claim 13, further comprising forming a trench in the second dielectric layer, the second hydrophilic layer and the second hardmask layer, and the via is exposed within the trench.

* * * * *